United States Patent
Schenker

(10) Patent No.: US 7,158,275 B2
(45) Date of Patent: Jan. 2, 2007

(54) POLARIZATION MODULATOR

(75) Inventor: Richard Schenker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/824,305

(22) Filed: Apr. 13, 2004

(65) Prior Publication Data

US 2005/0225829 A1 Oct. 13, 2005

(51) Int. Cl.
  *G02F 1/03* (2006.01)
  *G01J 4/00* (2006.01)
(52) U.S. Cl. .................... 359/256; 250/227.17
(58) Field of Classification Search .............. 359/246, 359/251, 256, 280–282, 288, 484, 494, 495; 250/227.17
See application file for complete search history.

(56) References Cited

U.S. PATENT DOCUMENTS

| | | | | |
|---|---|---|---|---|
| 4,302,079 A | * | 11/1981 | White | 359/352 |
| 5,633,959 A | * | 5/1997 | Niki et al. | 385/11 |
| 6,324,003 B1 | * | 11/2001 | Martin | 359/494 |
| 6,885,782 B1 | * | 4/2005 | Wood et al. | 385/11 |
| 2003/0072079 A1 | * | 4/2003 | Silverstein et al. | 359/486 |

OTHER PUBLICATIONS

Konstantinos Adam et al., "Polarization Effects in Immersion Lithography", Optical Mecrolithography XVII, Proceedings of SPIE vol. 5377, pp. 329-343, 2004.
Richard Schenker et al., "Material Limitations to 193-nm Lithographic System Lifetimes", SPIE vol. 2726, pp. 698-706.
Richard E. Schenker et al., "Ultraviolet-induced densification in fused silica", J. Appl. Phys. 82 (3), Aug. 1, 1997, pp. 1065-1071.
G. de Zwart et al., "Performance of a Step and Scan System for DUV Lithography", SPIE vol. 3051, pp. 817-830.
U.S. Appl. No. 10/813,453, filed Mar. 29, 2004, "Lithography Using Controlled Polarization".

* cited by examiner

*Primary Examiner*—Ricky Mack
*Assistant Examiner*—William Choi
(74) *Attorney, Agent, or Firm*—Fish & Richardson P.C.

(57) ABSTRACT

Systems and techniques for changing a polarization profile of light to a desired polarization profile. In some implementations, a polarization modulator is in communication with a stress modulator. The polarization modulator alters the polarization profile of light in response to applied stress from the stress modulator.

22 Claims, 4 Drawing Sheets

POLARIZATION MODULATOR

BACKGROUND

Electronic devices may be fabricated using a sequence of processes to form successive device layers on a substrate such as a silicon wafer. The successive device layers may be patterned using lithography, where the term lithography refers to techniques in which light (or particles such as electrons or ions) is used to transfer a pattern from a mask or reticle to a substrate.

Reducing the feature sizes of semiconductor devices allows for more functionality to be provided in a smaller area. However, smaller feature sizes pose significant lithography challenges. For example, as feature sizes decrease, the resolution of the lithography system must be sufficient to resolve them.

The resolution of a lithography system depends on a number of factors. One factor is the angle of the light used to image the features. Larger angles allow for higher resolution (and thus enable smaller device features).

Some existing systems and techniques may be used to improve resolution. These include off-axis illumination (OAI) and the use of phase shifting masks, such as embedded phase shift masks (EPSMs).

DESCRIPTION OF DRAWINGS

Like reference symbols in the various drawings indicate like elements.

DETAILED DESCRIPTION

Systems and techniques provided herein may improve the resolution capability of a lithography system of a given numerical aperture.

The numerical aperture (NA) of a lithography system is a measure of the largest angle that may be imaged using the system. The maximum numerical aperture value for imaging in air is one; higher numerical apertures may be obtained by imaging in liquid (referred to as immersion lithography). Available lithography systems have numerical apertures of up to about 0.85, with larger numerical aperture systems being postulated for the future.

Although larger angles increase the resolution of the lithography system, the resulting image may be degraded due to poor matching of the polarization between the light waves that are combined on the wafer to form the image. Images with higher contrast are formed when the polarization of the light at the imaging plane is primarily in the direction of the features being imaged.

Figure 1A:
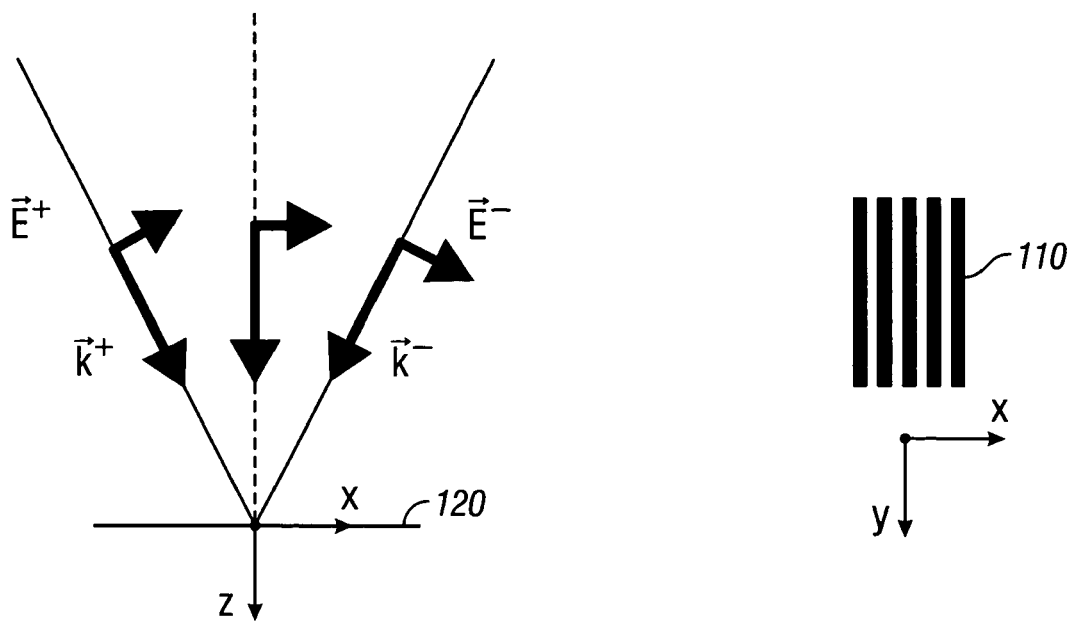
FIGS. 1A and 1B illustrate image formation for linearly polarized light.
Figure 1B:
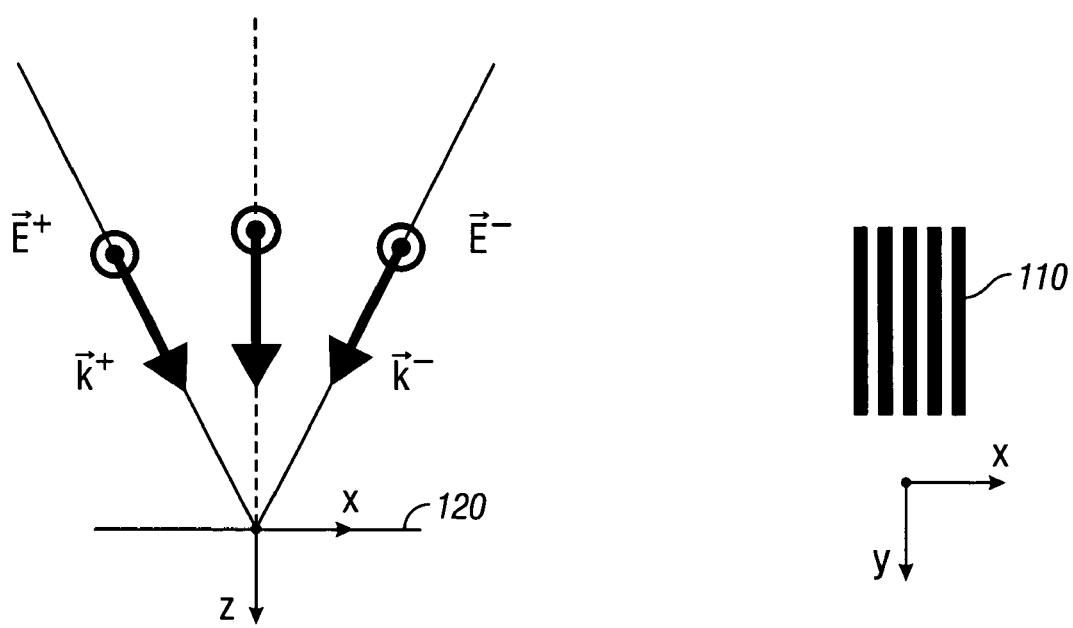

FIGS. 1A and 1B show two different linear polarization states for imaging light used to pattern periodic features 110. Note that the x, y, and z directions are defined for exemplary purposes and may be defined differently. In FIG. 1A, the imaging light is polarized in the xz plane. At an imaging plane 120, the combined light is polarized primarily in the x direction, with a component in the z direction. In FIG. 1B, the imaging light is polarized in the yz plane. At imaging plane 120, the combined light is polarized primarily in the y direction, without a component in the z direction.

For features extending primarily in the y direction (such as features 110 of FIGS. 1A and 1B), the polarization shown in FIG. 1B would form a more robust image than the polarization shown in FIG. 1A. That is, the image formed using the polarization shown in FIG. 1B would have higher contrast than the image formed using the polarization shown in FIB. 1A. However, a typical image will have some features extending primarily in the x direction and others extending primarily in the y direction. Therefore, light polarized primarily in one of the directions and not the other will form a relatively high contrast image for some features and a relatively low contrast image for others. For small features and/or large light angles, the contrast for features perpendicular to the polarization direction may be insufficient to properly image the feature.

Therefore, rather than using linearly polarized light, existing systems typically use elliptically or circularly polarized light (where circularly polarized light is a special case of elliptically polarized light with equal time-averaged x and y components). Thus, an image of relatively moderate contrast is formed regardless of the feature direction.

Figure 2:
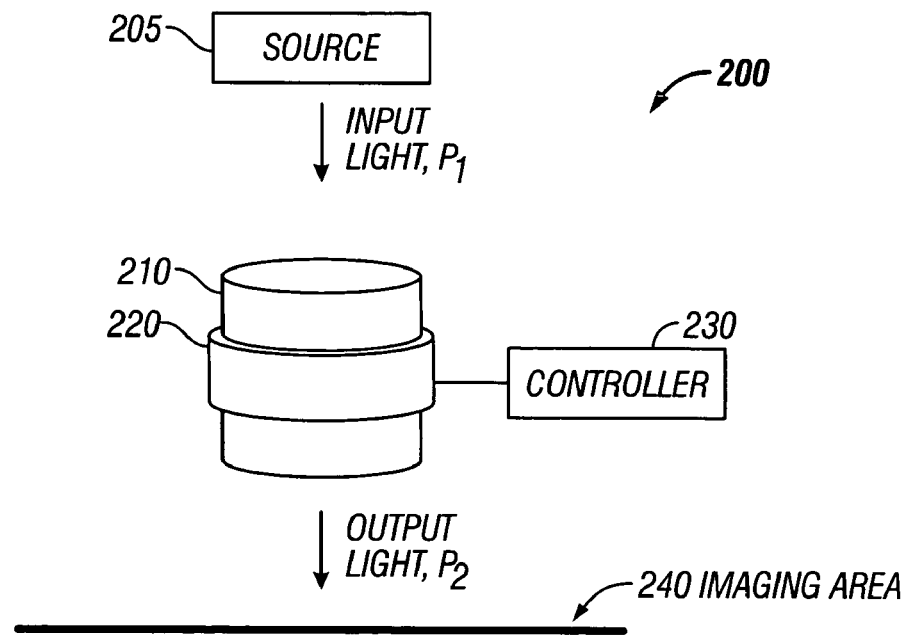
FIG. 2 is a schematic of a system for transforming the polarization of input light.

The current inventor determined that by customizing the polarization state of light within the imaging system, a relatively high contrast image may be formed for features oriented primarily in either the x or y direction (where, again, the x and y directions are defined for exemplary purposes and may be defined differently). FIG. 2 shows a system 200 for transforming input light to light having a desired polarization state.

A polarization modulator 210 is positioned between an illumination source 205 and an imaging area 240. A stress modulator 220 is in communication with polarization modulator 210, and may be used to apply a stress to polarization modulator 210. An optional controller 230 may be used to control the amount and/or direction of stress applied to polarization modulator 210 by stress modulator 220. For example, in some implementations, controller 230 may be used to turn the applied stress on and off, or to vary the spatial and/or temporal distribution of stress applied to polarization modulator 210.

In an implementation, controller 230 may receive a signal from one or more light sensors (not shown) that detects light transmitted from polarization modulator 210 (either at a position just after polarization modulator 210 or at some point along the path from modulator 210 to an imaging plane). Controller 230 may turn the applied stress on and off based on the signal from the sensor, or may vary the spatial and/or temporal distribution of applied stress based on the signal.

In another implementation, controller 230 may receive a signal based on a pattern formed on a substrate using light transmitted from modulator 210. For example, a wafer may be patterned with a first applied stress on modulator 210. One or more parameters of the pattern may be measured (e.g., the contrast of the features in the pattern), and a signal provided to controller 230 based on the measurement. Controller 230 may control the applied stress based on the measurement. Of course, many other implementations are possible. For example, the desired stress for particular processing conditions may be known (e.g., the polarization may be calibrated prior to installing the polarization modulator in a lithography system), and controller 230 may control the stress based on a different parameter, such as the ambient temperature.

Stress modulator 220 may be implemented in a number of ways. For example, stress modulator 220 may be implemented using a clamping mechanism, so that an inner diameter of stress modulator 220 may be mechanically decreased to apply stress to polarization modulator 210. In another example, stress modulator 220 may be implemented using material with a thermal expansion coefficient sufficiently large to apply a desired stress amount in response to a change in temperature. In another example, stress modulator 220 may restrict the outer diameter of polarization modulator 210, and polarization modulator 210 may be heated or cooled. In this example, the thermal expansion or contraction of the polarization modulator 210 is used to produce the stress. Many other implementations are possible.

Figure 3:
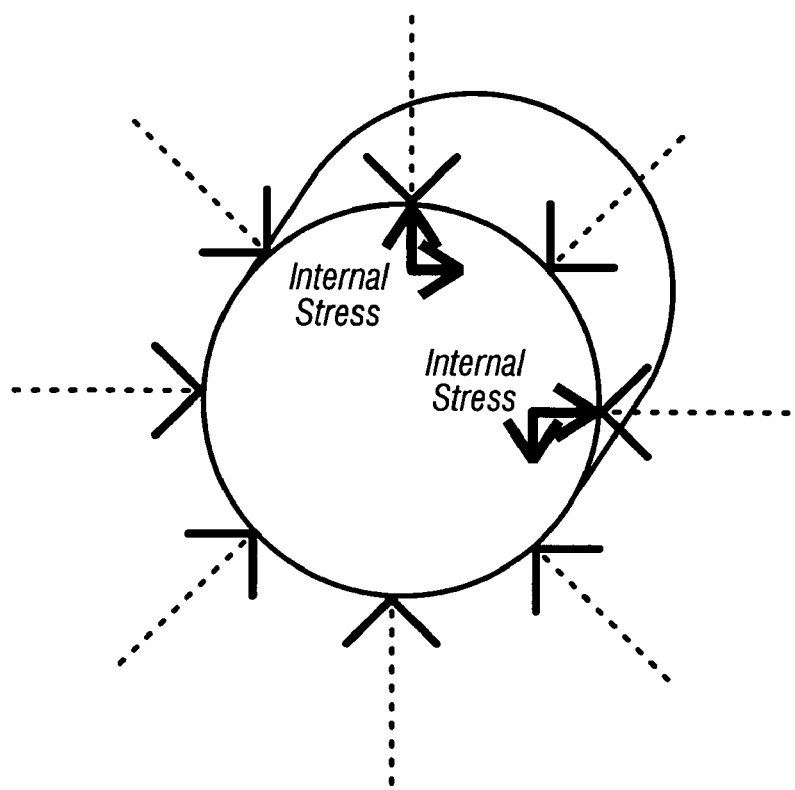
FIG. 3 illustrates internal stress generated by applied external stress.

In an implementation, polarization modulator 210 is a glass cylinder or disc. External stress applied to the glass creates internal stress within the glass, as illustrated in FIG. 3. The stress makes the glass optically birefringent, with a refractive index asymmetry that is a function of the angle around the cylinder. The resulting stress-induced birefringence causes light that passes through the element to change polarization. Light output from modulator 210 thus has a polarization state $P_2$ different than polarization state $P_1$ of the input light.

In system 200, the principal stress directions and associated optical axis vary as a function of angle within modulator 210. For an implementation in which modulator 210 is a glass cylinder, the top and bottoms of the glass cylinder rotate the polarization of incoming light in an equal but opposite direction compared to the left and right sides of the cylinder. By providing a modulator 210 having an appropriate geometry and stress profile, the polarization may be customized.

System 200 may be used in different types of lithography systems. For example, system 200 may be used in a system imaging in air or may be used in an immersion system. System 200 may be used in lithography systems using any visible or ultra-violet wavelength (for example, 248 nm, 193 nm, 157 nm). System 200 may be used in systems incorporating various illumination types such as conventional or an annular illumination.

Figure 4:
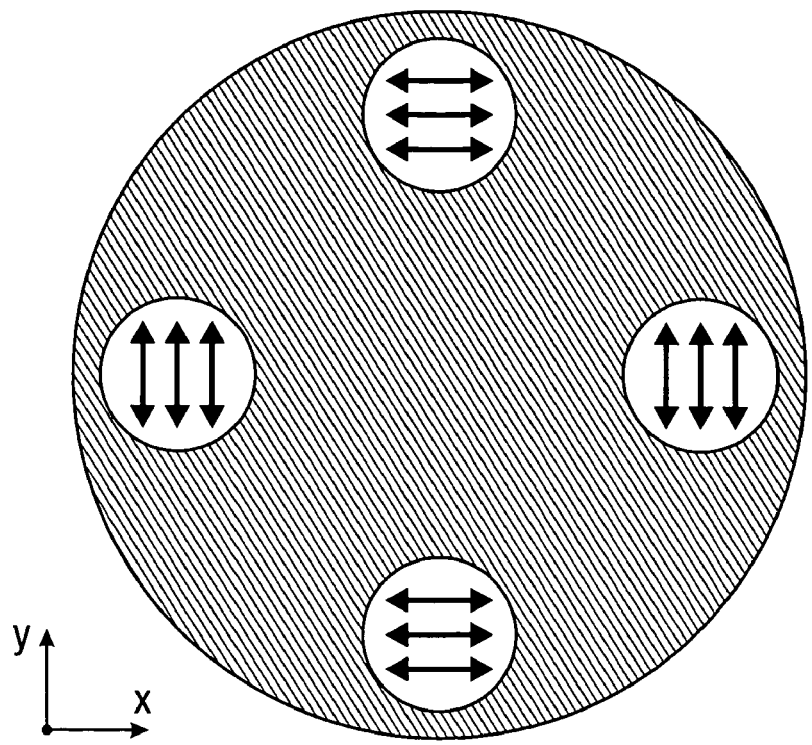
FIG. 4 shows an output polarization profile for quadrupole illumination with poles on the x- and y-axis.

FIG. 4 shows an exemplary output polarization profile that that may be obtained using quadrupole illumination with poles on the x- and y-axis. The x- and y-axes in FIG. 4 represent angles of incidence on a mask being imaged by the lithography system. The profile shown in FIG. 4 may be obtained by applying a uniform normal stress on the curved surfaces of a cylindrical or disc-shaped glass polarization modulator. Light at large x-angles is polarized in the y direction, while light at large y-angles is polarized in the x direction.

Figure 5:
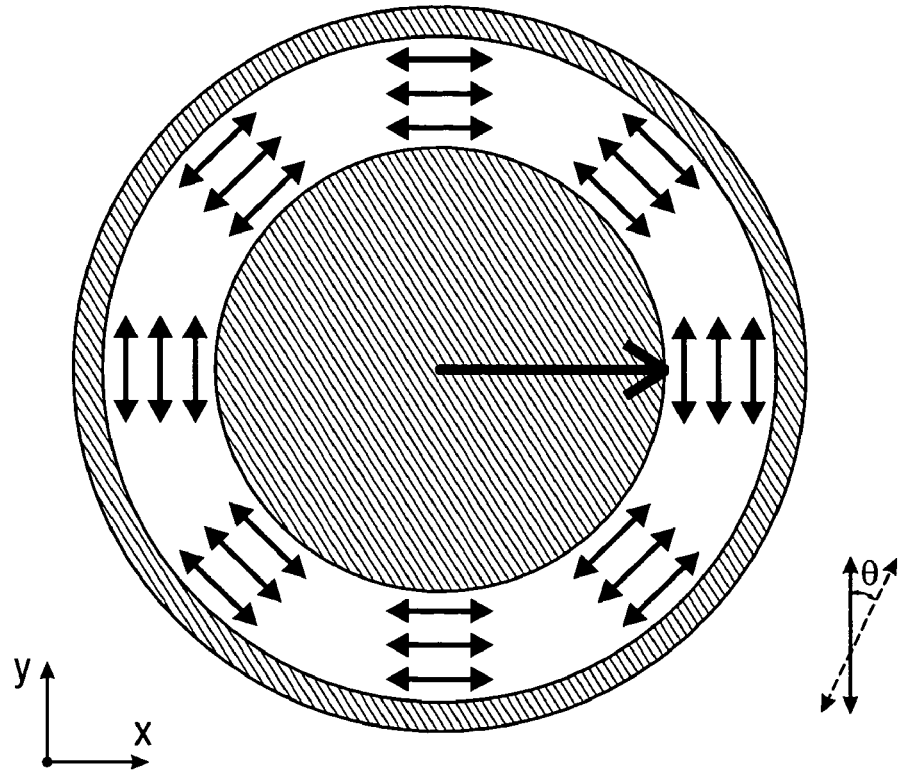
FIG. 5 shows an output polarization profile for annular illumination.

FIG. 5 shows an exemplary output polarization for annular illumination. The x- and y-axes in FIG. 5 represent angles of incidence on a mask being imaged by the lithography system. Each polarization direction is perpendicular to each unit circle radius vector. That is, the polarization profile obtained exhibits azimuthal symmetry. Of course, in a real system, some deviation from azimuthal symmetry would generally occur. In a real system, the polarization profile may be described as having substantially azimuthal symmetry; that is, the polarization direction at a location may vary from the theoretical desired direction (in this example, perpendicular to a radial vector) by an angle $\theta$. In some applications, $\theta$ may be on the order of a few degrees (e.g., 5–10 degrees), or may be up to about 15 degrees from the perpendicular. Alternatively, the illumination at the 45 degree angles (x-angle=y-angle) could be circularly polarized for most applications.

Figure 6:
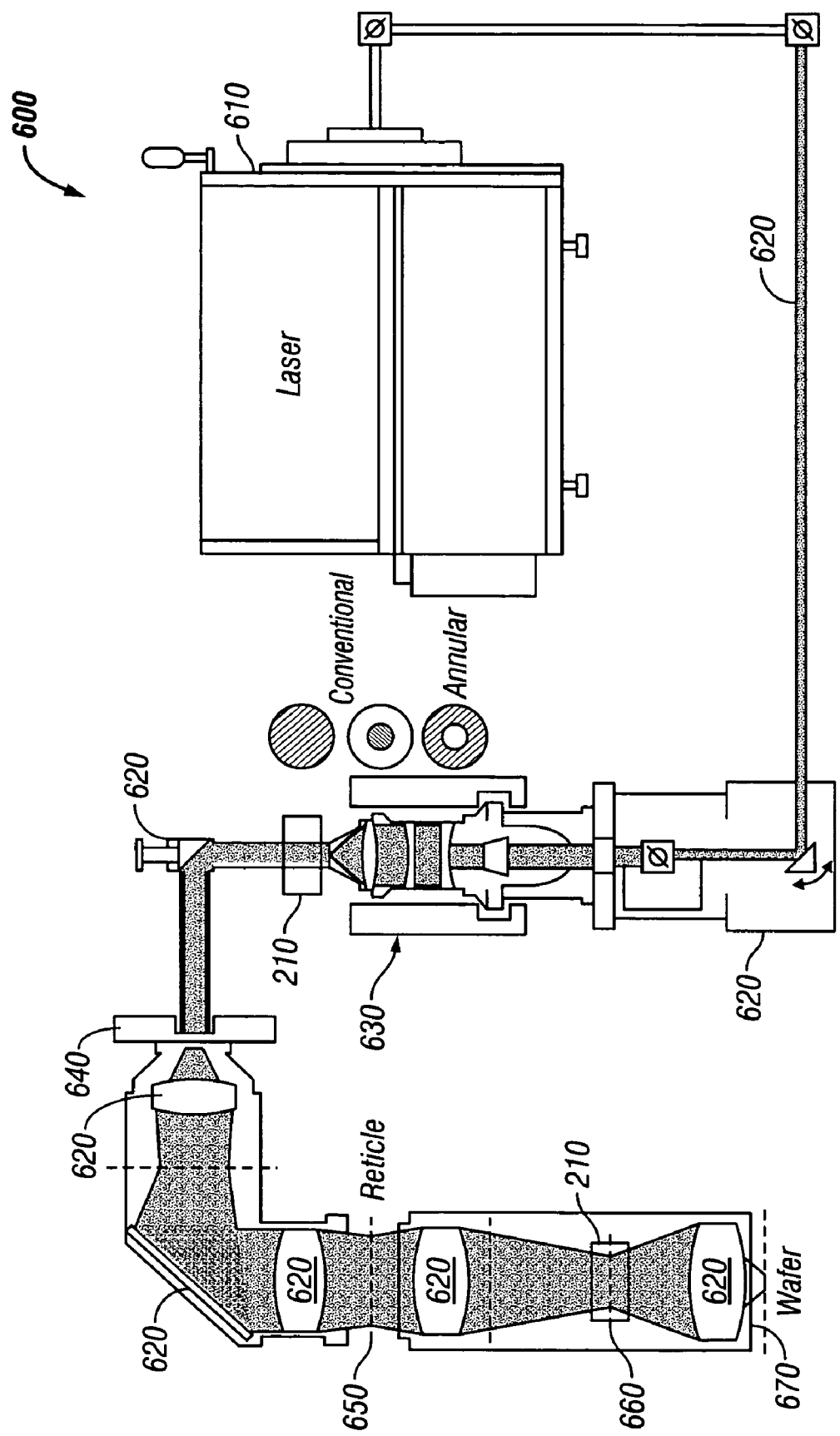
FIG. 6 shows a lithography system for deep ultraviolet (DUV) lithography.

System 200 may be incorporated in a lithography system in a number of ways. FIG. 6 shows an exemplary lithography system 600 for deep ultraviolet (DUV) lithography. A light source such as a laser 610 produces light, which is directed toward an imaging surface 650 using components 620, which may include a beam delivery system, automated beam steering unit, and optical components such as mirrors and lenses.

An illuminator 630 shapes the beam for transmission through a scanning reticle masking assembly 640 and then through a reticle 650. The beam is focused at an imaging surface; for example, on a top surface of a wafer 670.

A polarization modulator such as modulator 210 of FIG. 2 may be positioned in system 600 so that the beam has the desired polarization state at wafer 670. For example, modulator 210 may be positioned just after illuminator 630, or may be integrated with illuminator 630. Modulator 210 may be positioned in a pupil plane 660 of system 600. Other implementations are possible. For example, multiple modulators 210 may be included in system 600 (e.g., a first modulator positioned in the pupil plane and a second modulator positioned after an illuminator).

A number of implementations have been described. Nevertheless, it will be understood that various modifications may be made without departing from the spirit and scope of the invention. For example, although a DUV lithography system was shown in FIG. 6, other types of lithography systems may be used (e.g., systems using different wavelengths of light and/or immersion lithography systems). Although FIG. 6 illustrates a step-and-scan system (referred to as a stepper), the systems and techniques herein may be used with non-stepper systems. Additionally, stress may be applied to either compress or expand the polarization modulator. Accordingly, other implementations are within the scope of the following claims.

What is claimed is:

1. A system, comprising:
   a lithography system comprising:
   a polarization modulator configured to change light which is applied thereto from a first polarization profile to a second polarization profile different than the first polarization profile; and
   a stress modulator in communication with the polarization modulator, the stress modulator to apply stress to the polarization modulator, wherein the stress modulator is configured to apply stress to an outer surface of the polarization modulator to obtain a polarization profile at an imaging plane wherein the polarization profile exhibits substantially azimuthal symmetry.

2. A lithography system, comprising:
   a polarization modulator configured to change light which is applied thereto from a first polarization profile to a second polarization profile different than the first polarization profile; and
   a stress modulator in communication with the polarization modulator, the stress modulator to apply stress to the polarization modulator, wherein the lithography system comprises an immersion lithography system.

3. The lithography system of claim 2, wherein the stress modulator is to apply stress to the polarization modulator to obtain a polarization profile that exhibits substantially azimuthal symmetry at an imaging plane.

4. A system, comprising:
a lithography system, comprising:
a polarization modulator configured to change light which is applied thereto from a first polarization profile to a second polarization profile different than the first polarization profile; and
a stress modulator in communication with the polarization modulator, the stress modulator to apply normal stress on a curved surface of the polarization modulator, wherein the stress modulator is configured to apply stress using expansion.

5. The lithography system of claim 4, wherein the stress modulator is to apply stress to the polarization modulator to obtain a polarization profile that exhibits substantially azimuthal symmetry at an imaging plane.

6. A system, comprising:
a lithography system, comprising:
a polarization modulator configured to change light which is applied thereto from a first polarization profile to a second polarization profile different than the first polarization profile; and
a stress modulator in communication with the polarization modulator, the stress modulator to apply normal stress on a curved surface of the polarization modulator, wherein the stress modulator is configured to apply stress by heating at least one of the stress modulator and the polarization modulator.

7. The lithography system of claim 6, wherein the stress modulator is to apply stress to the polarization modulator to obtain a polarization profile that exhibits substantially azimuthal symmetry at an imaging plane.

8. A system, comprising:
a lithography system, comprising:
a polarization modulator configured to change light which is applied thereto from a first polarization profile to a second polarization profile different than the first polarization profile; and
a stress modulator in communication with the polarization modulator, the stress modulator to apply normal stress on a curved surface of the polarization modulator,
wherein the stress modulator is configured to apply stress by cooling at least one of the stress modulator and the polarization modulator.

9. The lithography system of claim 8, wherein the stress modulator is to apply stress to the polarization modulator to obtain a polarization profile that exhibits substantially azimuthal symmetry at an imaging plane.

10. A lithography system, comprising:
a polarization modulator configured to change light which is applied thereto from a first polarization profile to a second polarization profile different than the first polarization profile; and
a stress modulator in communication with the polarization modulator, the stress modulator to apply stress to the polarization modulator, further comprising:
another polarization modulator positioned to receive light having a received polarization profile and to transmit light having a different transmitted polarization profile; and
another stress modulator in communication with the another polarization modulator, the another stress modulator to apply stress to the another polarization modulator.

11. The lithography system of claim 10, wherein the stress modulator is to apply stress to the polarization modulator to obtain a polarization profile that exhibits substantially azimuthal symmetry at an imaging plane.

12. A method of modifying the polarization of light, comprising:
applying stress to a polarization modulator;
receiving light of a first polarization state in the polarization modulator;
modifying the polarization of light within the polarization modulator;
detecting a parameter related to one or more characteristics of the light;
transmitting light of a second polarization state different than the first polarization state from the polarization modulator; and
forming a pattern on a substrate using the transmitted light,
wherein the parameter is related to the second polarization state.

13. The method of claim 12, wherein applying stress to the polarization modulator comprises inducing birefringence in the polarization modulator.

14. The method of claim 12, wherein applying stress to the polarization modulator comprises applying normal stress on a curved surface of the polarization modulator.

15. A method of modifying the polarization of light, comprising:
applying stress to a polarization modulator;
receiving light of a first polarization state in the polarization modulator;
modifying the polarization of light within the polarization modulator;
transmitting light of a second polarization state different than the first polarization state from the polarization modulator;
detecting a parameter related to one or more characteristics of the second polarization state of the light; and
forming a pattern on a substrate using the transmitted light,
wherein the parameter is based on the pattern.

16. The method of claim 15, wherein applying stress to the polarization modulator comprises inducing birefringence in the polarization modulator.

17. The method of claim 15, wherein applying stress to the polarization modulator comprises applying normal stress on a curved surface of the polarization modulator.

18. An apparatus, comprising:
a component of a lithography system, including:
a polarization modulator configured to polarize light transmitted therethrough from a first polarization profile to a second polarization profile different than the first polarization profile;
a stress modulator in communication with the polarization modulator, the stress modulator to apply normal stress on a curved surface of the polarization modulator to induce birefringence and to change the polarization of light transmitted through the polarization modulator;
a controller configured to receive a signal based on a parameter related to one or more characteristics of the transmitted light, the controller in communication with the stress modulator and configured to control the stress; and
a light sensor positioned to receive at least a portion of the transmitted light, the light sensor in communication with the controller wherein the signal based on the parameter is a signal from the light sensor;

wherein the parameter is based on the second different polarization profile.

19. The apparatus of claim 18, wherein the stress modulator is to apply stress to the polarization modulator to obtain a polarization profile that exhibits substantially azimuthal symmetry at an imaging plane.

20. A polarization control apparatus, comprising:
a polarization modulator configured to change light which is applied thereto from a first polarization profile to a second polarization profile different than the first polarization profile;
a stress modulator in communication with the polarization modulator, the stress modulator to apply stress to the polarization modulator;
a controller configured to receive a signal based on a parameter related to one or more characteristics of the transmitted light, the controller in communication with the stress modulator and configured to control the stress; and
a substrate including a pattern formed using the transmitted light,
wherein the parameter is based on the pattern.

21. The polarization control apparatus of claim 20, wherein:
the polarization control apparatus comprises an optical lithography system;
the light comprises a lithographic light suitable for patterning the substrate.

22. The polarization control apparatus of claim 20, wherein the stress modulator is to apply stress to the polarization modulator to obtain a polarization profile that exhibits substantially azimuthal symmetry at an imaging plane.

* * * * *